US006884697B2

(12) United States Patent
Schwarzenbach et al.

(10) Patent No.: US 6,884,697 B2
(45) Date of Patent: Apr. 26, 2005

(54) PROCESS FOR CLEAVING A WAFER LAYER FROM A DONOR WAFER

(75) Inventors: Walter Schwarzenbach, Saint Nazaire les Eymes (FR); Christophe Maleville, La Terrasse (FR)

(73) Assignee: S.O.I.Tech Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/341,254

(22) Filed: Jan. 14, 2003

(65) Prior Publication Data

US 2003/0134489 A1 Jul. 17, 2003

(30) Foreign Application Priority Data

Jan. 16, 2002 (FR) .............................................. 02 00475

(51) Int. Cl.[7] .............................................. H01L 21/301
(52) U.S. Cl. ........................................ 438/464; 438/458
(58) Field of Search ................................. 438/458, 464, 438/460; 257/E21.568, E21.57

(56) References Cited

U.S. PATENT DOCUMENTS

| 5,374,564 | A | 12/1994 | Bruel ........................... 438/455 |
| 6,100,165 | A | 8/2000 | Sakaguchi et al. ............ 438/455 |
| 6,372,609 | B1 | 4/2002 | Aga et al. ..................... 438/459 |
| 6,413,874 | B1 * | 7/2002 | Sato ............................. 438/714 |
| 6,455,446 | B1 * | 9/2002 | Narukawa et al. ............ 438/795 |
| 2001/0001975 | A1 | 5/2001 | Sakaguchi et al. ........... 156/239 |
| 2002/0102857 | A1 | 8/2002 | Sato ............................. 438/714 |

FOREIGN PATENT DOCUMENTS

| EP | 0 533 551 A | 3/1993 |
| EP | 0 926 713 | 6/1999 |
| EP | 0 948 032 | 10/1999 |
| EP | 0 961 312 | 10/1999 |
| EP | 1 045 448 | 10/2000 |

* cited by examiner

*Primary Examiner*—George Fourson
*Assistant Examiner*—Julio J. Maldonado
(74) *Attorney, Agent, or Firm*—Winston & Strawn LLP

(57) ABSTRACT

The invention relates to improvements in a process and annealing device for cleaving a wafer layer along a weakened zone in a donor wafer using a thermal anneal. In one improvement, at least one donor wafer is provided in a substantially horizontal position during the thermal anneal to prepare a wafer layer which, after detachment, has a cleaved surface with reduced surface roughness irregularities. The donor wafer can be preferably placed inside a chamber between two heating electrodes during the thermal anneal. The thermal anneal can be conducted to detach the wafer layer or the donor wafer to mechanical action to detach the wafer layer after the thermal anneal is conducted. Either way, a cleaved surface is provided on the detached wafer layer that does not include isolated dense areas adjacent the wafer layer periphery.

19 Claims, 2 Drawing Sheets

U.S. Patent    Apr. 26, 2005    Sheet 2 of 2    US 6,884,697 B2
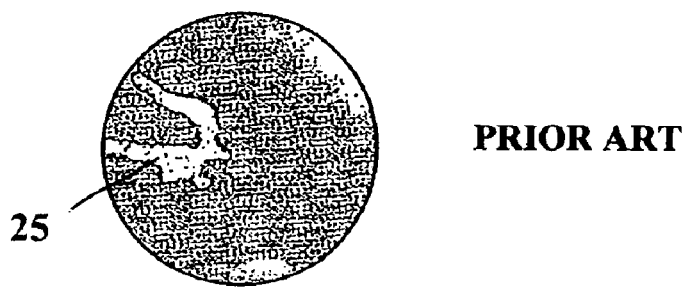
PRIOR ART
FIG.3
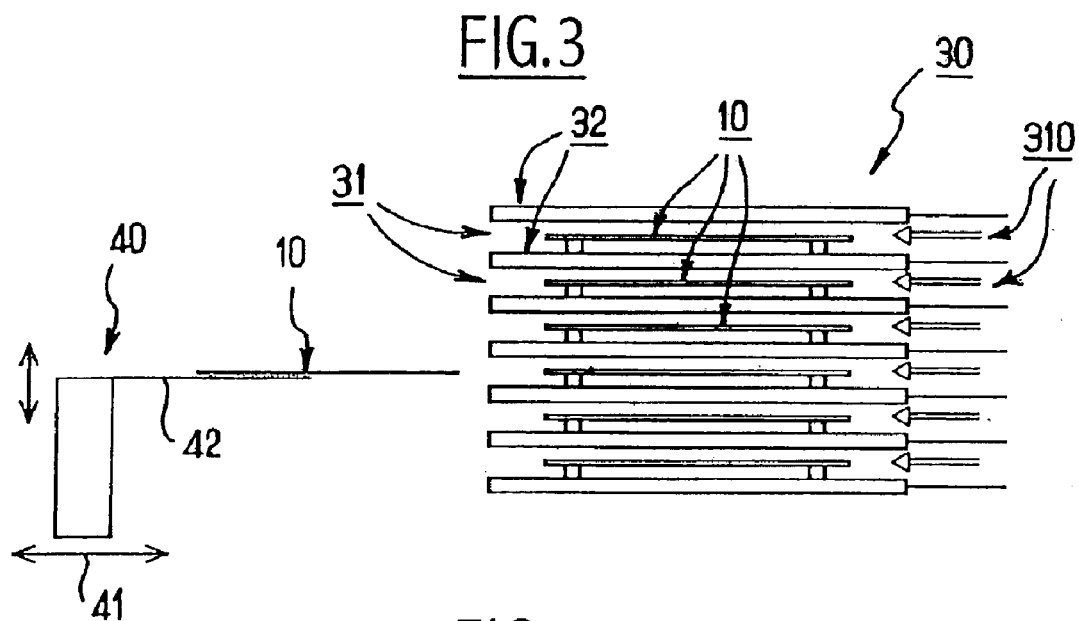
FIG.4
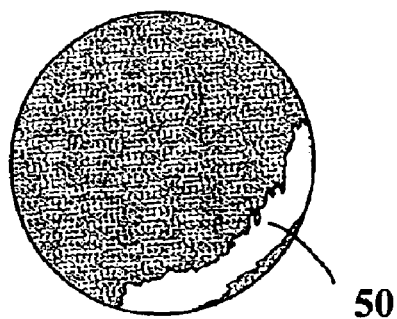
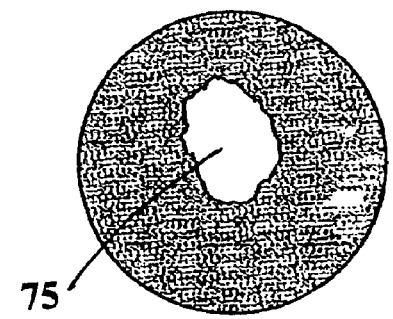
FIG.5a  
PRIOR ART
FIG.5b

US 6,884,697 B2

PROCESS FOR CLEAVING A WAFER LAYER FROM A DONOR WAFER

BACKGROUND ART

The present invention relates in general to the processing of materials, and more particularly semiconductor substrates for use in electronic, optic and optoelectronic components. More specifically, the invention relates to a process for cleaving two layers of a wafer along an embrittled or weakened zone between the two layers, wherein the process includes a thermal anneal for the purpose of cleaving the layers.

Processes of the aforementioned type are already generally known. In particular, the skilled artisan is aware of how to utilize such known processes in order to produce cleavage of the layers. Generally, a layer is cleaved from the substrate along a weakened zone that has been previously created by the implantation of species within the substrate. The implanted species may be ions or atoms. Thus, it is known to implant a substrate of a semiconductor material such as silicon with ions or atoms of hydrogen or helium to provide this weakened zone.

The weakened zone is determined with respect to the nature of the material, the nature of the species implanted and the energy of implantation. Generally, the weakened zone is in the form of a plane that is oriented essentially parallel to the implantation surface of the substrate.

It is likewise possible to produce the weakened zone by other means known in the art, for example by constructing an intermediate region of porous material between two regions of dense material, by forming an oxide layer embedded in a substrate (for example a Silicon On Insulator ("SOI") substrate), or by bonding together two layers wherein the bonding area provides the weakened zone.

The cleaving of a layer along a weakened zone can be used to obtain thin layers, the thickness of which may range between a fraction of a micron and several microns, as described, for example, in U.S. Pat. No. 5,374,564. This document describes a process known by the name SMART-CUT® which is used to manufacture SOI structures. The main steps of SOI manufacturing according to this process are as follows:

Oxidation of an upper silicon plate in order to create an oxide layer (which corresponds to the embedded oxide layer of the SOI structure), Implantation of ions into the upper plate for the purpose of creating a weakened zone, and to delimit, on the one hand, by means of this zone, the SOI structure (situated on the side of the embedded oxide) and, on the other hand, a silicon material, Bonding of the upper plate onto a supporting plate which may be made of silicon or of another material, Cleaving of a layer, preferably by annealing the structure, for the purpose of:

cleaving on one hand a SOI structure comprising the supporting plate, the embedded oxide layer and the silicon layer situated between the embedded oxide and the weakened zone and, on the other hand, the silicon material situated on the other side of the weakened zone. In addition, upon completion of the cleaving process, cohesive forces may still exist between the two layers, which thereby remain integral with one another.

Detaching the two layers, i.e., by physically disconnecting them, during or after the thermal anneal, Additional treatment intended to reduce the surface roughness of the SOI resulting from the cleaving and detachment processes.

Hereinafter within this text, the structures to be treated and the layers constituting them that are to be detached will be designated by the generic term "wafer". The term "donor wafer" will also be used to designate the material from which the wafer layers are to be cleaved and will include both single materials, e.g., silicon, as well as composite or bonded structures of two or more different materials or components, such as a base wafer of one material that is bonded to a substrate or support of a different material.

The surface condition of the wafers is an extremely important factor, as very stringent specifications are imposed with respect to the subsequent use of the wafers following the detachment process, for example, when semiconductor material is used to form electronic, optical or optoelectronic components. This surface condition is characterized, in particular, by the surface roughness of the wafers following detachment. It is therefore common to find specifications for roughness that should not exceed 5 Angströms expressed as a RMS (or Root Mean Square) value. The measurements of roughness are generally made with an atomic force or AFM microscope. With this type of device, the roughness of surfaces scanned by the tip of the AFM microscope is measured, ranging from $1\times1~\mu m^2$ to $10\times10~\mu m^2$ and more rarely up to $50\times50~\mu m^2$, or even $100\times100~\mu m^2$.

It is also made clear that it is possible to measure the surface roughness using other methods, in particular by means of a "haze" measurement. In particular, this method has the advantage of making it possible to quickly characterize the uniformity of the roughness over an entire surface area. This haze, measured in ppm, is the result of a method which utilizes the optical reflection properties of the surface being characterized, and corresponds to an optical "background noise" diffused by the surface due to its microroughness.

An example of the relationship between haze and roughness, in the case of the surface of a conventional SOI, is illustrated in FIG. 1. It is indicated that the haze measurements that will be provided in this text are taken according to the same protocol and by means of the same device, in this case an instrument of the KLA Tencor Surfscan SPI® type.

It is likewise indicated that a SMARTCUT®-type process can also be used to form structures other than SOI structures, for example Silicon On Anything ("SOA") or even Anything on Anything ("AOA") structures. Cleaving and detachment anneals are conventionally carried out in annealing furnaces a typical configuration of which is illustrated in FIG. 2. Furnaces such as this are capable of simultaneously processing a plurality of wafers. FIG. 2 thus shows a plurality of wafers 10 arranged on a receptacle 11 such as a quartz boat, the wafers being aligned in parallel. The boat 11 is itself place on a loader 12 fastened to a door 13 for sealing the mouth of the furnace. The assembly 100 formed by the door 13, the loader 12 and the boat and the wafers supported by the loader is capable of moving in relation to an furnace structure 20 which comprises a quartz processing tube 21 around which a heating element 22 is wound. A pyrometer tube 23 equipped with thermocouples is likewise provided.

The furnace of FIG. 2 is shown in open position. In a closed position, the assembly 100 is inserted into the furnace structure 20, the door 13 blocking the mouth of the furnace. Inside of each wafer to be detached, the two layers forming the wafer face each other so that the useful surfaces, for which it is desired to control the surface condition in an extremely precise manner, are placed face-to-face. Therefore, it is particularly important to take measures to ensure the best possible surface condition (specifically roughness) for these useful surfaces.

Returning to the prior art illustrated in FIG. 2, the wafers to be detached are therefore arranged vertically. In this way, the two layers of each wafer being detached are prevented from moving and do not move in relation to one another (specifically following the detachment process, when the detached layers are removed from the furnace).

A relative movement of the two layers such as this might actually run the risk of producing scratches on the surfaces of the detached layers. And it is likewise very important that the surface condition (and in particular the roughness) of these layers be as even as possible, on the surface of the layer.

FIG. 3 illustrates the surface roughness of a SOI wafer after detachment, following a cleaving anneal that has been carried out in a conventional manner in an annealing furnace, such as that shown in FIG. 2. The roughness is represented by means of a haze measurement. This FIG. 3 illustrates a dissymmetry in the roughness of the SOI structure, which corresponds to a lower haze 25 on the part of the SOI structure located at the bottom part of the furnace, which is the so-called "notch" of the SOI structure that is placed on the bottom during annealing. It is shown as being situated to the left, at 9-o'clock in FIG. 3.

Thus, it appears that if known detachment anneals actually make it possible to prevent movements capable of leading to the formation of scratches, they promote irregularities in the surface roughness of the layers resulting from the detachment process. This constitutes a disadvantage that is now remedied by the present invention.

SUMMARY OF THE INVENTION

The invention relates to improvements in a process for cleaving a wafer layer along a weakened zone in a donor wafer using a thermal anneal. One improvement comprises providing at least one donor wafer in a substantially horizontal position during the thermal anneal to prepare a wafer layer which, after detachment, has a cleaved surface with reduced surface roughness irregularities. The donor wafer is preferably placed inside a chamber between two heating electrodes during the thermal anneal, and the thermal anneal is conducted to detach the wafer layer and provide a cleaved surface that does not include isolated dense areas adjacent the wafer layer periphery.

Advantageously, a plurality of donor wafers are provided and the process further comprises individually grabbing each donor wafer and placing it substantially horizontally between two heating electrodes before the donor wafers are subjected to the thermal anneal inside a chamber. The heating electrodes and donor wafers may be stacked so that the plurality of donor wafers can be simultaneously subjected to the thermal anneal in the chamber. When a plurality of donor wafers are provided and the process can further include individually retrieving each wafer layer that is detached from the donor wafer. These wafer layers can be detached by the thermal anneal or by subjecting the donor wafer to mechanical action after the thermal anneal.

The invention also relates to improvements in an annealing device for cleaving a wafer layer along a weakened zone in a donor wafer using a thermal anneal. This improvement comprises means for providing at least one donor wafer in the annealing device in a substantially horizontal position during the thermal anneal to prepare a wafer layer which, after detachment, has a cleaved surface with reduced surface roughness irregularities.

Some preferred but non-limiting features of the inventive process are as follows:

the structure is placed inside of a chamber between two heating electrodes, means are provided for handling the layers of material in a horizontal position, the handling is carried out individually for each wafer, the handling is carried out individually for each layer, a plurality of wafers are annealed simultaneously, each wafer being placed between two heating electrodes.

And, according to another aspect, the invention proposes the application of a process such as the one mentioned above for cleaving two layers of material delimited by a weakened zone that has been produced by means of a SMARTCUT®-type process.

The device generally includes a chamber and the providing means advantageously comprises two heating electrodes and means for supporting a donor wafer between the two electrodes in the substantially horizontal position during the thermal anneal. As above, the thermal anneal can be conducted to detach the wafer layer and provide a cleaved surface that does not include isolated dense areas adjacent the wafer periphery, or the device can include means for subjecting the donor wafer to mechanical action to detach the wafer layer after the thermal anneal is conducted.

In this device, a plurality of donor wafers can be provided with the providing means comprising means for holding each donor wafer in a substantially horizontal position between two heating electrodes before the donor wafers are subjected to the thermal anneal in a chamber. The device can include means for individually handling each donor wafer that is to be placed in the substantially horizontal position between the electrodes, preferably in the form of a wafer handling robot. Also, the device can include means for individually retrieving each wafer layer that is detached from the donor wafer, again preferably in the form of a wafer handling robot.

Advantageously, the weakened zone is provided in the donor wafer by implantation of ions or atoms. Preferably, the donor wafer comprises a semiconductor material such as silicon, typically in different forms, such as a silicon on insulator structure and a silicon support.

Preferred but non-limiting features of such an application are as follows:

the two layers of material comprise a silicon layer, the two layers of material are two silicon layers, one of the two layers corresponding to the surface layer of a SOI structure, the other layer corresponding to a silicon residue.

BRIEF DESCRIPTION OF THE DRAWINGS

Other features, objectives and advantages of the invention will become more apparent upon reading the following description of one embodiment of the invention, made with reference to the appended drawings in which, FIGS. 1 to 3, as noted above, are representations of the prior art:

FIG. 4 is a schematic representation of a facility for carrying out cleaving anneals, enabling implementation of the invention, FIGS. 5a and 5b represent, respectively, spatial distributions of haze on the surface of two SOI structures, the SOI structure of FIG. 5a being the representation of one that has undergone a cleaving anneal in a furnace customarily used for this purpose according to prior art, while the SOI of FIG.

Figure 1:
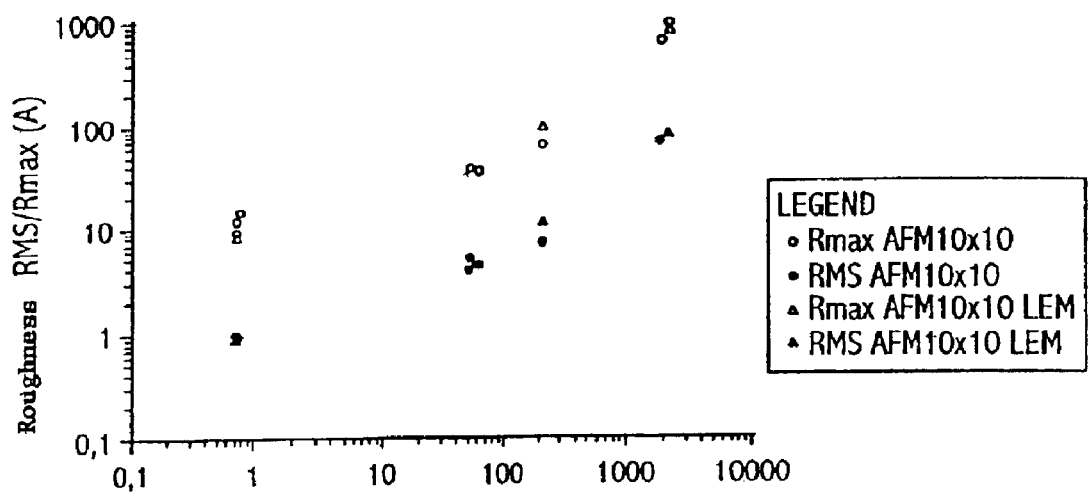

5b having itself undergone a cleaving anneal while being disposed substantially horizontally inside its annealing furnace according to the invention.

DETAILED DESCRIPTION OF THE PREFERRED EMBODIMENTS

In this description, the term "substantially horizontal" means and is intended to include horizontal as well as deviations of as much as ±30 degrees and preferably ±15 degrees therefrom. Of course, the most preferred positioning of the donor wafer would be at or as close to horizontal as practically possible, although it is recognized that industrial tolerances would prohibit a completely horizontal position from being achieved. Of course, the deviation from horizontal should not be so great as to cause symmetric surface roughness irregularities or isolated dense areas adjacent the wafer layer periphery from occurring in the surface of the detached wafer layer.

With specific reference to FIG. 4, a furnace 30 has been shown which is used according to the invention for carrying out the cleaving anneal of a plurality of wafers 10. More specifically, each wafer 10 is placed inside a chamber 31 formed by two adjacent electrodes 32 of a plurality of electrodes in the furnace 30. And these electrodes 32, which run parallel to each other in a horizontal direction, define horizontal chambers 31, each of which is capable of accommodating one donor wafer 10 from which a wafer layer is to be detached, in horizontal position.

Heating of the wafer is ensured by a gas that penetrates into the chambers 31 by way of respective inlets 310, this gas itself being heated by the electrodes that define the boundaries of each chamber. It should be noted that the "heating" gas may be used solely for the purpose of diffusing the heat coming from the electrodes onto the wafers. It may also have been preheated, prior to its introduction into the furnace.

The specific configuration of the "horizontal" furnace used according to the invention for carrying out a cleaving anneal makes it possible to eliminate the effects of a temperature gradient inside the furnace, between the top and bottom parts of the furnace. This leads to a substantial improvement in the evenness of the surface roughness of the layers, after they have been detached.

Figure 2:
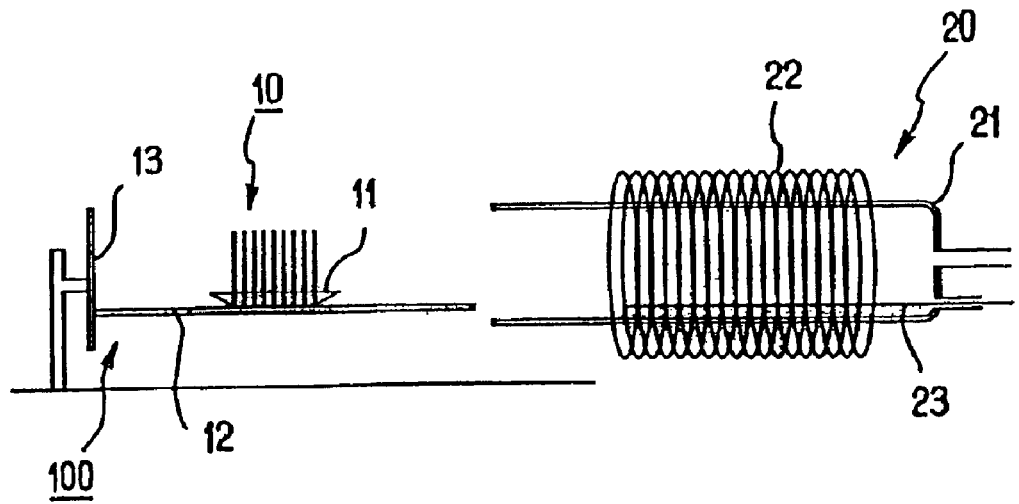

In this regard, the effect of using a "horizontal" furnace according to the invention, for the purpose of a cleaving anneal, has been illustrated in FIGS. 5a and 5b. FIG. 5a shows the distribution of haze on the surface of a detached SOI structure following a conventional cleaving anneal in a "vertical" furnace, as illustrated in FIG. 2. This figure, which is analogous to FIG. 3, reveals a "dense region" 50 corresponding to an irregularity in roughness in the lower right part of the layer.

Conversely, FIG. 5b shows the perfectly symmetrical roughness of a SOI detached after a cleaving anneal carried out in a "horizontal" furnace according to the invention. And this roughness no longer exhibits the characteristic of a "dense region" as observed in the case of the SOI structure of FIG. 5a. Instead, a dense region 75 is illustrated in FIG. 5b as being in the central area of the wafer. Thus the use of a "horizontal" furnace according to the invention makes it possible to overcome the problems associated with a "dense region" of roughness as mentioned above with respect to prior art cleaving anneals.

In addition, it indicated that provisions are also made, in the case of the "horizontal" furnace of FIG. 4, to prevent any movement of the layers which might produce scratches, in particular when the detached layers are being unloaded from the oven.

In this regard, a handling robot 40 has been shown in FIG. 4, which is capable of:
  individually grabbing:
    the donor wafers in order to introduce them into the furnace, and
    the detached wafer layers, in order to take them out of the oven after cleaving.
  and of moving in one direction 41 (as well as in a "vertical" direction perpendicular thereto) in order to carry out the necessary loading and unloading operations (while processing each wafer individually).

It is to be noted that, in the case where the detachment of the two layers of the wafer is actually carried out during annealing, the two layers of the wafer that are detached may be unloaded by the robot separately. In this regard, the arm 42 of the robot which grabs the wafers and/or the layers may comprise means such as a suction cup capable of being placed under partial vacuum selectively, or else means that handles the wafer layers by their edges in order to grab each wafer layer separately from the donor wafer from which it has been detached.

Also, the means can be means that enable the donor and wafer layers to be handled simultaneously with a view to detaching them outside of the furnace. In this embodiment, the cleaving anneal is carried out without completing the detachment of the wafers, with the wafer layer detachment being completed outside of the furnace after the robot 40 has unloaded the cleaved wafers, for example, by means of mechanical action. The wafers and layers remain horizontal while the robot 40 is carrying out these handling operations.

In addition, the above examples can also be applied to a cleaving operation making it possible to produce a SOI structure, in particular by means of a SMARTCUT®-type process. Thus, the invention applies to the cleaving of any structure that includes a weakened zone that makes it possible to cleave and detach wafer layers from a donor wafer.

What is claimed is:

1. In a process for cleaving a wafer layer along a weakened zone in a donor wafer using a thermal anneal, the improvement which comprises providing at least one donor wafer in a substantially horizontal position during the thermal anneal to prepare a wafer layer which, after detachment, has a cleaved surface with reduced surface roughness irregularities, wherein the donor wafer is placed inside a chamber between two heating electrodes during the thermal anneal, and the thermal anneal is conducted to detach the wafer layer and provide a cleaved surface that does not include isolated dense areas adjacent the wafer layer periphery.

2. The process according to claim 1, wherein a plurality of donor wafers are provided and the process further comprises individually grabbing each donor wafer and placing it substantially horizontally between two heating electrodes before the donor wafers are subjected to the thermal anneal inside a chamber.

3. The process according to claim 2, wherein the heating electrodes and donor wafers are stacked so that the plurality of donor wafers can be simultaneously subjected to the thermal anneal in the chamber.

4. The process according to claim 1, wherein a plurality of donor wafers are provided and the process further comprises individually retrieving each wafer layer that is detached from the donor wafer.

5. The process according to claim 1, wherein the weakened zone is provided in the donor wafer by implantation of ions or atoms.

6. The process according to claim 1, wherein the donor wafer comprises silicon.

7. The process according to claim 6, wherein the donor wafer includes a silicon on insulator structure and a silicon support.

8. The process according to claim 1, wherein, after the thermal anneal, the donor wafer is subjected to mechanical action to detach the wafer layer.

9. The process according to claim 1, wherein a plurality of donor wafers are provided and each donor wafer is held in a substantially horizontal position between the two heating electrodes before the donor wafers are subjected to the thermal anneal in a chamber.

10. The process according to claim 1, which further comprises individually handling each donor wafer that is to be placed in the substantially horizontal position between the electrodes.

11. The process according to claim 1, wherein the individual handling is accomplished by a wafer handling robot.

12. The process according to claim 1, which further comprising individually retrieving each wafer layer that is detached from the donor wafer.

13. The process according to claim 1, wherein the individual retrieval is accomplished by a wafer handling robot.

14. The process according to claim 1, which further comprises subjecting the donor wafer to mechanical action to detach the wafer layer after the thermal anneal is conducted.

15. A process for cleaving a plurality of wafer layers along weakened zones in donor wafers using a thermal anneal, wherein the weakened zones are provided in the donor wafers by implantation of ions or atoms, the improvement which comprises providing the plurality of donor wafers in a substantially horizontal position during the thermal anneal to prepare wafer layers which, after detachment, each have a cleaved surface with reduced surface roughness irregularities, wherein the donor wafers are placed inside a chamber between two heating electrodes during the thermal anneal by a wafer handling robot, the thermal anneal is conducted to detach the wafer layers and provide cleaved surfaces that do not include isolated dense areas adjacent wafer layers peripheries, and the cleaved wafer layers are retrieved after detachment from the donor wafer by the robot.

16. The process according to claim 15, which further comprises utilizing the robot to individually handle each donor wafer that is to be placed in the substantially horizontal position between the electrodes.

17. The process according to claim 16, which further comprising utilizing the robot to individually retrieve each wafer layer that is detached from the donor wafer.

18. The process according to claim 15, which further comprises subjecting the donor wafers to mechanical action to detach the wafer layers after the thermal anneal is conducted.

19. The process according to claim 15, wherein the donor wafers each comprise silicon.

* * * * *

UNITED STATES PATENT AND TRADEMARK OFFICE
CERTIFICATE OF CORRECTION

PATENT NO. : 6,884,697 B2
DATED : April 26, 2005
INVENTOR(S) : Schwarzenbach et al.

It is certified that error appears in the above-identified patent and that said Letters Patent is hereby corrected as shown below:

Title page,
Item [73], Assignee, change "S.O.I.Tech" to -- S.O.I.Tec --.

Signed and Sealed this

Nineteenth Day of July, 2005

JON W. DUDAS
*Director of the United States Patent and Trademark Office*